(12) United States Patent
Gordon

(10) Patent No.: US 6,586,159 B2
(45) Date of Patent: Jul. 1, 2003

(54) METHOD FOR USING A COATED FLUOROPOLYMER SUBSTRATE PELLICLE IN SEMICONDUCTOR FABRICATION

(75) Inventor: Joseph S. Gordon, Gardiner, NY (US)

(73) Assignee: DuPont Photomasks, Inc., Round Rock, TX (US)

( * ) Notice: Subject to any disclaimer, the term of this patent is extended or adjusted under 35 U.S.C. 154(b) by 180 days.

(21) Appl. No.: 09/772,774

(22) Filed: Jan. 30, 2001

(65) Prior Publication Data

US 2001/0010882 A1 Aug. 2, 2001

Related U.S. Application Data

(62) Division of application No. 09/371,823, filed on Aug. 11, 1999, now Pat. No. 6,280,885.

(51) Int. Cl.[7] ................................................. G03C 5/00
(52) U.S. Cl. ........................................ 430/311; 430/396
(58) Field of Search ............................ 430/5, 311, 396; 428/14, 422; 378/34, 35

(56) References Cited

U.S. PATENT DOCUMENTS

| 4,657,805 A | 4/1987 | Fukumitsu et al. ......... 428/215 |
| 5,061,024 A | 10/1991 | Keys .......................... 359/350 |
| 5,168,001 A | 12/1992 | Legare et al. ............... 428/194 |
| 5,286,567 A | 2/1994 | Kubota et al. |
| 5,370,951 A * | 12/1994 | Kubota et al. ................. 430/5 |
| 5,693,382 A | 12/1997 | Hamada et al. |
| 6,101,237 A * | 8/2000 | Miyachi et al. ............... 378/35 |
| 6,280,885 B1 * | 8/2001 | Gordon ......................... 430/5 |

FOREIGN PATENT DOCUMENTS

| EP | 0416528 A2 | 9/1990 | ............ G03F/1/14 |
| EP | 0554150 A1 | 12/1993 | ............ G03F/1/14 |

OTHER PUBLICATIONS

XP002150319 English language Abstract from Japanese App. No. 04081756A Mar. 16, 1992.
XP002150320 English language Abstract from Japanese App. No. 04308801A Oct. 30, 1992.
XP002150321 English language Abstract from Japanese No. 04110801A Apr. 13, 1992.
International Search Report for PCT/US00/19215 Oct. 27, 2000.

* cited by examiner

Primary Examiner—Mark F. Huff
Assistant Examiner—Saleha R. Mohamedulla
(74) Attorney, Agent, or Firm—Baker Botts L.L.P.

(57) ABSTRACT

A dust cover having a film with an inorganic, anti-reflective coating and method for use during semiconductor fabrication. The dust cover is primarily for use during photolithography. The dust cover may include an amorphous fluoropolymer film having an inorganic, anti-reflective coating attached to a frame. The inorganic, anti-reflective coating preferably has a refractive index below 1.4.

20 Claims, 2 Drawing Sheets

METHOD FOR USING A COATED FLUOROPOLYMER SUBSTRATE PELLICLE IN SEMICONDUCTOR FABRICATION

CROSS REFERENCE TO RELATED APPLICATIONS

This application is a divisional from U.S. patent application Ser. No. 09/371,823, filed by Joseph S. Gordon on Aug. 11, 1999 and entitled "Dust Cover and Method for Semiconductor Fabrication," now U.S. Pat. No. 6,280,885.

This application is related to U.S. patent application Ser. No. 09/772,777, filed by Joseph S. Gordon on Jan. 30, 2001, entitled "Dust Cover For Use In Semiconductor Fabrication".

TECHNICAL FIELD OF THE INVENTION

This invention relates in general to the field of semiconductor wafer fabrication and, more particularly, to a dust cover having a film with an inorganic, anti-reflective coating and method of use.

BACKGROUND OF THE INVENTION

Semiconductor manufacturing often involves a series of processes including deposition, photolithography and etching. During the photolithographic process, semiconductor manufacturers often use a photomask to copy an image of an electronic circuit on to a semiconductor wafer. Photomasks come in various sizes and shapes (e.g., a one times photomask or a reticle, which is a photomask that can be shot several times onto a single wafer with a photolithographic tool known as a stepper). Photomasks generally include a quartz blank with a patterned chrome layer deposited on one surface of the quartz blank. This patterned metal layer contains a microscopic image of an electronic circuit.

During the photolithographic process, this image is projected onto a wafer. If the image is projected several times onto a single wafer, the photomask is known as a reticle. As design rules have moved toward smaller and more dense integrated circuit (IC) devices, the quality of the projected image has become increasingly important. A poorly projected image may result in the manufacture of a non-functioning IC device. In many cases, a dust particle resting on the surface of a photomask or reticle, causes sufficient distortion of the projected image to render the IC device non-functioning.

As such, many, if not most, IC manufacturers rely on a dust cover film, which may on occasion be referred to as a pellicle, to keep dust from landing on the surface of the photomask. Typically, the film is attached to a frame, which may be attached to the photomask such that the film is held at a fixed distance from the surface of the photomask. During the photolithographic process, the image of any dust particle resting on the film will be out of focus on the wafers surface. As a result, the probability of a dust induced defect at the wafer surface is reduced.

Ideally, a dust cover film should be invisible to the radiant energy of the photolithographic tool. In order to produce clear, well-defined patterns, the film should preferably transmit nearly 100% of the radiant energy used. Most films, however, do not transmit 100% of the radiant energy. A small percentage of the radiant energy is reflected at the interfaces of the film's surface and air. Generally, the amount of light reflected at the interface of two transparent layers (e.g., air and film) depends upon the refractive index, N, of the two layers. More precisely, the amount of reflection depends upon the difference between the N of the first layer and the N of the second layer. The greater the difference, the more reflection.

The index of refraction, N, for air is approximately 1.0. A dust cover film, on the other hand, may have an N of 1.5 or greater. This difference in index of refraction can result in an average reflection of approximately 8 percent of the light striking the surface at a normal incidence (90 degrees to the face of the film). Moreover, taking into account interference within the film, there may be peak reflections of approximately 16 percent. As a result, considerably less than 100 percent of the radiant energy used during the photolithographic process passes through the dust cover film.

Conventional techniques for combating this problem involve the addition of a film layer having a lower refractive index to a substrate film, which is usually made of nitrocellulose. The additional film layer is often spun onto the substrate film. As such, the substrate film needs to be relatively thick (approximately 1–2 $\mu$m) to withstand the forces associated with the spinning process. Moreover, when thinner substrate films are used, damage to the substrate film during the spinning process becomes more likely.

Other conventional solutions include using a single layer of film with a relatively low refractive index. This conventional single layer approach does not allow for producing a dust cover film with a refractive index much below 1.4.

SUMMARY OF THE INVENTION

In accordance with teachings of the present disclosure, a dust cover film with an inorganic, anti-reflective coating and method of use are described. The described film and method of use provide significant advantages over prior technologies.

According to one aspect of the present disclosure a dust cover is described for use during photolithography. The cover includes a frame attached to a fluoropolymer film having an inorganic, anti-reflective coating. The frame may be manufactured from various materials including, for example, aluminum. The inorganic, anti-reflective coating preferably has a refractive index below 1.3. More preferably, the inorganic, anti-reflective coating has a refractive index between 1.13 and 1.2.

In one embodiment, the coated fluoropolymer film could be an amorphous fluoropolymer. The amorphous fluoropolymer may include, for example, copolymers of 30 to 99 mole percent perfluoro-2,2-dimethyl-1,3-dioxole (PDD) and complementary amounts of at least one comonomer. Preferably, the copolymers will have a glass transition temperature of at least 80° Celsius.

The fluoropolymer film may also include an inorganic anti-reflective coating of calcium fluoride ($CaF_2$). The coating may be applied in a number of ways, for example, physical vapor deposition. Other inorganic fluorides may also be used. For example, magnesium fluoride ($MgF_2$) may be substituted for $CaF_2$.

One method of manufacturing a coated film for use in a dust cover incorporating teachings of the present invention includes evaporating an inorganic coating material in a vacuum chamber and depositing it on a fluoropolymer film. The pressure in the chamber may be increased above normal to lower the refractive index of the resulting inorganic anti-reflective coating. A good approximate starting pressure may be $1 \times 10^{-4}$ torr. The factors affecting the appropriate pressure include, among others, source and type of fluoride, size and type of film, rate of deposition and desired refractive index.

The technical advantages of a dust cover incorporating teachings of the present invention include an increased transmission percentage as well as an increased durability (i.e., longer life cycle). These advantages may help improve efficiencies during a photolithographic process. In addition, the disclosed dust cover should have improved transmission across a broad spectrum of frequencies.

Another technical advantage of the present invention arises during manufacture of the dust cover itself. Conventionally, an anti-reflective coating is placed in solution and spun onto a substrate film. The dynamics of this systems as well as the solvents used when creating the solutions often damage the substrate film. An inorganic anti-reflective coating may be applied via physical vapor deposition, which should help reduce manufacturing problems.

Other technical advantages will be apparent to one of ordinary skill in the art in view of the specification, claims, and drawings.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION

Preferred embodiments of the present invention and their advantages are best understood by reference to FIGS. 1 through 4, where in like numbers are used to indicate like and corresponding parts.

Figure 1:
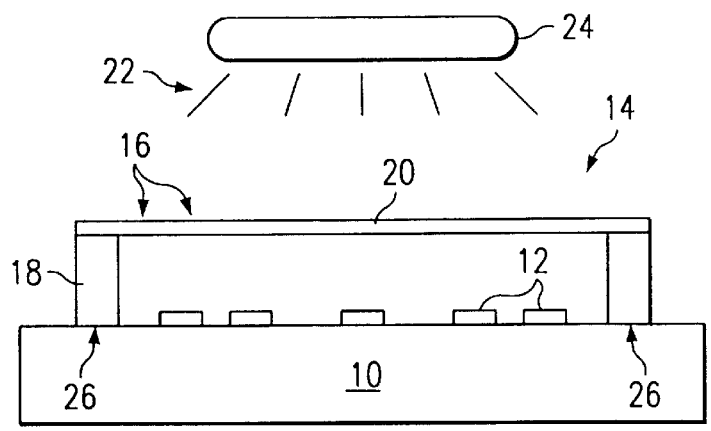
FIG. 1 shows a cross-sectional view of a photomask with a dust cover incorporating teachings of the present invention mounted thereto.

FIG. 1 shows a cross-sectional view of a photomask 10 having a patterned layer 12, which may be formed from a variety of materials (e.g., chrome). Patterned layer 12 forms a microscopic image of a circuit that may be projected onto a wafer. FIG. 1 shows a dust cover, indicated generally at 14, incorporating teachings of the present disclosure. Dust cover 14 may be coupled to Photomask 10 such that dust particles, figuratively represented at 16, alight on dust cover 14 as opposed to photomask 10. When coupling dust cover 14 to photomask 10, receiving surfaces 26 may rest upon photomask 10.

Photomask 10 may have a variety of sizes and shapes. For example, photomask 10 may be round, rectangular or square. Photomask 10 may also be any of a variety of photomask types. For example, photomask 10 may be a one time master, a five inch reticle or a six inch reticle.

As depicted in FIG 1, dust cover 14 includes a frame 18, which may be formed of aluminum, and a film 20 attached to frame 18. Film 20 may include a coated substrate film of fluoropolymer. In preferred embodiments, the substrate film may include an amorphous fluoropolymer coated with an inorganic anti-reflective coating.

Film 20 provides a surface upon which dust particles 16 may alight. As such, dust particles 16 remain a defined distance away from photomask 10. This may be especially important during the photolithographic process of IC manufacturing. During photolithography, photomask 10 and dust cover 14 are exposed to radiant energy, indicated generally at 22, produced by a photolithographic tool, figuratively represented at 24. Radiant energy 22 may include light of various wave lengths, for example, deep ultra violet light.

In operation film 20 maintains dust particles 16 a defined distance from photomask 10 and allows a large percentage of radiant energy 22 to pass through it. As such, dust particles 16 will likely be out of focus at the surface of the wafer being shot and the exposed image should be clear and well-defined.

Figure 2A:
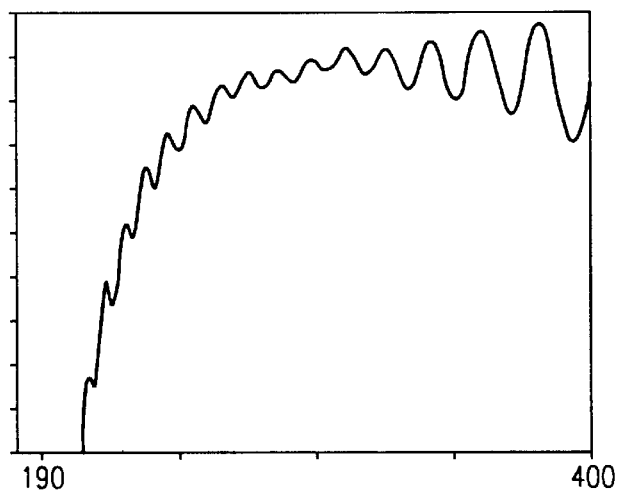
FIG. 2A shows a graph relating the percentage of light transmitted verses the wavelength of light transmitted for a fluoropolymer film without an inorganic, anti-reflective coating.

The graph of FIG. 2A shows the percentage of light transmitted through a fluoropolymer film with no coating verses the wavelength of light, measured in nanometers. The film tested to produce FIG. 2A transmitted approximately 98.7% of light having a wavelength of 306 nanometers.

Figure 2B:
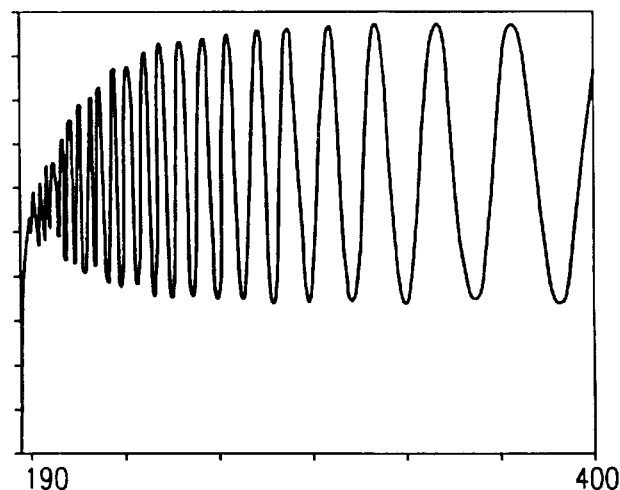
FIG. 2B shows a graph relating the percentage of light transmitted verses the wavelength of light transmitted for a fluoropolymer film with an inorganic, anti-reflective coating.

The graph of FIG. 2B shows the percentage of light transmitted through a coated film incorporating teachings of the present invention verses the wavelength of light, measured in nanometers. The coated film tested to produce FIG. 2B had an amorphous fluoropolymer substrate and an inorganic anti-reflective coating. At wavelengths of approximately 306 nanometers, the coated film of FIG. 2B transmitted over 99% of the radiant energy. In addition to allowing more radiant energy to transmit through the coated film, the coated film may also prove to be more durable than non-coated film.

Figure 3:
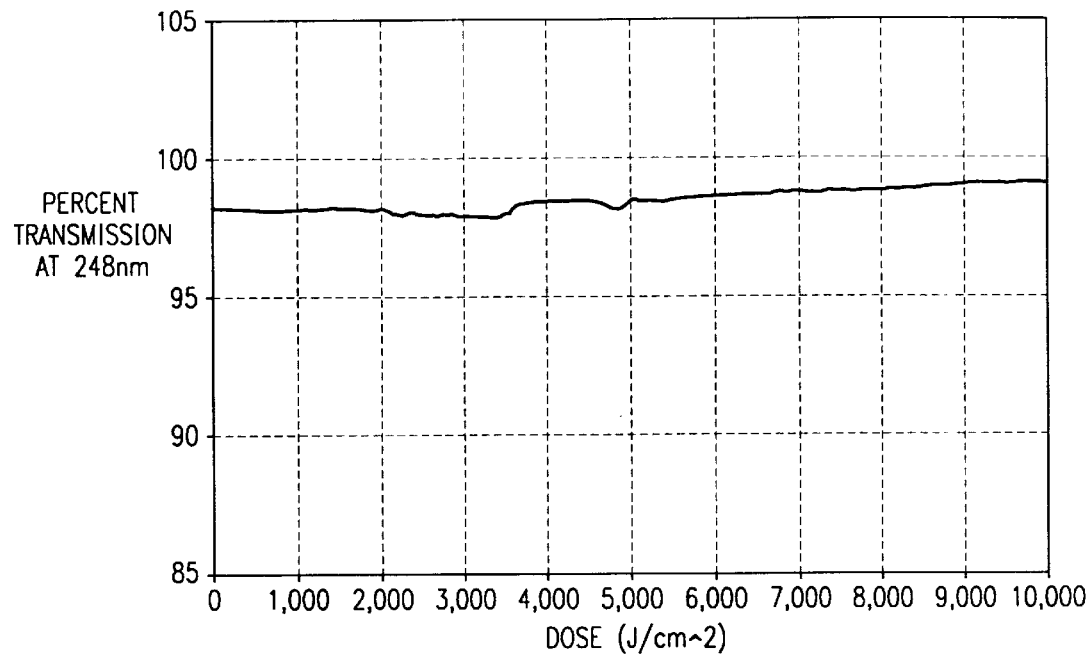
FIG. 3 shows a graph relating the percentage of light transmitted at approximately 248 nanometers to the amount of radiant energy used measured in jewels per centimeter squared for an amorphous fluoropolymer film with an inorganic anti-reflective coating.

FIG. 3 shows a graph depicting the percentage of light transmitted through a dust cover film incorporating teachings of the present invention at wavelengths of approximately 248 nanometers. The FIG. 3 graph plots light transmission for different amounts of radiant energy doses measured in jewels per centimeter squared. The film used to produce the graph of FIG. 3 had an amorphous fluoropolymer substrate and an inorganic anti-reflective coating.

Figure 4:
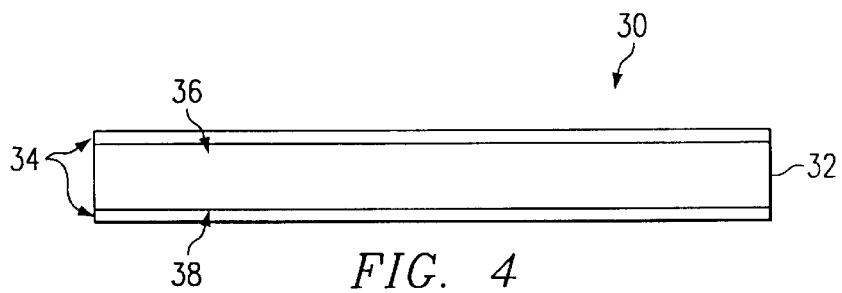
FIG. 4 shows an enlarged cross-sectional view of a dust cover film incorporating teachings of the present invention including an amorphous fluoropolymer substrate coated with inorganic, anti-reflective coating.

FIG. 4 shows an enlarged cross-sectional view of a coated fluoropolymer film, depicted generally at 30, incorporating teachings of the present disclosure. Film 30 includes an amorphous fluoropolymer substrate 32 coated with an inorganic, anti-reflective coating 34. Substrate 32 has a top surface 36 and a bottom surface 38. In the depicted embodiment of FIG. 4, substrate 32 has a coating 34 on both top surface 36 and bottom surface 38.

As depicted in FIG. 4, coated fluoropolymer film 30 includes an amorphous fluoropolymer substrate 32. The amorphous fluoropolymer of substrate 32 may include, for example, copolymers of 30 to 99 mole percent perfluoro-2, 2-dimethyl-1,3-dioxole (PDD) and complementary amounts of at least one comonomer. Preferably, the copolymer will have a glass transition temperature of at least 80° Celsius. The at least one comonomer may be selected from the class consisting of the following compounds:

(a) tetrafluoroethylene,
(b) cholorotrifluoroethylene,
(c) vinylidene fluoride,
(d) hexafluoropropylene,
(e) trifluoroethylene,
(f) perfluoro (alkyl vinyl ethers) of the formula $CF_2=CFOR_F$, where $R_F$ is a normal perfluoroalkyl radical having 1–3 carbon atoms,
(g) fluorovinyl ethers of the formula $CF_2=CFOQZ$, where Q is a perfluorinated alkylene radical containing 0–5 ether oxygen atoms, wherein the sum of the C and O atoms in Q is 2 to 10; and Z is a group selected from the class consisting of —COOR, —$SO_2F$, —CN, and —$OCH_3$, where R is a $C_1$–$C_4$ alkyl,
(h) vinyl fluoride, and
(i) (perfluoroalkyl) ethylene, $R_fCH=CH_2$, where $R_f$ is a $C_1$–$C_8$, normal perfluoroalkyl radical.

As used herein, the term "complementary" means that the mole percentage of PDD plus the mole percentages of any or all of the above comonomers (a) through (i) that are present in a copolymer add together to equal approximately 100%.

The comonomers may also have preferred upper limits regarding their respective mole percentages. For example, preferred upper mole percentage limits, $M_a \ldots M_i$, for the above-listed comonomers may be as follows:
(a) for tetrafluoroethylene, $M_a=70$,
(b) for chlorotrifluoroethylene, $M_b=70$,
(c) for vinylidene fluoride, $M_c=70$,
(d) for hexafluoropropylene, $M_d=15$,
(e) for trifluoroethylene, $M_e=30$,
(f) for $CF_2=CFOR_f$, $M_f=30$,
(g) for $CF_2=CFOQZ$, $M_g=20$,
(h) for vinyl fluoride, $M_h=70$, and
(i) for $R_fCH=CH_2$, $M_i=10$;

In another embodiment, an amorphous fluoropolymer may include more than one comonomer. Amorphous fluoropolymers with more than one comonomer will preferably limit the amount of each comonomer present in the copolymer such that the sum, S, of the ratios of the actual mole percentages, $m_a \ldots m_i$, relative to the corresponding preferred upper limit mole percentages, $M_a \ldots M_i$, is no larger than 1, as shown below:

$$S=m_a/M_a+m_b/M_b+\ldots+m_i/M_i \leq 1.$$

Anti-reflective coating 34 may be applied as a single layer coating (as depicted in FIG. 4). When applying a single layer coating, the following equation may help define the preferred index of refraction for the single layer anti-reflective coating:

$$N_{ar}=N_s$$

$N_{ar}$=index of refraction for anti-reflective coating
$N_s$=index of refraction for substrate film.

For example, a fluoropolymer substrate film for use with deep ultra violet photolithography may have a refractive index of 1.29 to 1.44. As such, a single layer anti-reflective coating for this fluoropolymer substrate may have a preferred index of refraction between 1.13 and 1.2.

As an alternative to a single layer coating, multiple layers of coating may be applied to substrate 32. Each of the multiple layers may have a slightly different refractive index. For example, a three coating system may be employed. The first coat may, for example, have a reflective index of 1.3, which is relatively close to a typical refractive index for amorphous fluoropolymer film (i.e., approximately 1.4). The second coating may have a reflective index of 1.2, and the third coat may have a reflective index of 1.1, which is relatively close to the refractive index of air (i.e., approximately 1.0). As such, the difference in refractive index between any two layers would be approximately 0.1. This would equate to nearly 100% transmission of radiant energy during the photolithographic process.

Although the disclosed embodiments have been described in detail, it should be understood that various changes, substitutions and alterations can be made to the embodiments without departing from their spirit and scope.

What is claimed is:

1. A method for fabricating a semiconductor device, comprising:
   placing an inorganic anti-reflective coating on a film, the antireflective coating having a refractive index less than or equal to 1.2;
   attaching the film to a same to form a dust cover;
   coupling the dust cover to a photomask; and
   exposing the dust cover and the photomask to radiant energy.

2. The method of claim 1, wherein the radiant energy comprises deep ultra violet radiation.

3. The method of claim 1, further comprising:
   removing the film from the frame; and
   attaching a new film to the frame.

4. A method for fabricating a semiconductor device comprising:
   applying an inorganic anti-reflective coating to a fluoropolymer substrate having a top and bottom surface, the anti-reflective coating having a refractive index less than or equal to 1.2;
   coupling the coated fluoropolymer substrate to a frame operable to support the coated fluoropolymer substrate to for a dust cover;
   resting the dust cover on a reticle;
   positioning a semiconductor wafer proximate the reticle; and
   applying radiant energy to the semiconductor wafer through the dust cover and reticle.

5. The method of claim 4 further comprising:
   applying a plurality of adjoining inorganic anti-reflective coatings to the fluoropolymer substrate; and
   each adjoining inorganic anti-reflective coating having a different refractive index.

6. The method of claim 5 further comprising differing the refractive index of adjoining inorganic anti-reflective coatings by approximately 0.1.

7. The method of claim 4 further comprising the fluoropolymer substrate having a refractive index between 1.29 and 1.44.

8. The method of claim 4 further comprising the inorganic anti-reflective coating having a refractive in ex between 1.13 and 1.2.

9. The method of claim 4 further comprising the fluoropolymer substrate consisting of an amorphous fluoropolymer having between 30 and 99 mole percent perfluoro-2,2-dimethyl-1,3-dioxole and complementary amounts of at least one comonomer.

10. The method of claim 4 further comprising the inorganic anti-reflective coating including calcium fluoride.

11. The method of claim 4 further comprising applying the inorganic anti-reflective coating to the top surface and the bottom surface of the fluoropolymer substrate.

12. The method of claim 4 further comprising the thickness of the fluoropolymer substrate having a thickness of approximately 0.8 μm.

13. A method for fabricating a semiconductor device comprising:
   coupling a fluoropolymer substrate coated with an inorganic anti-reflective coating having a refractive index less than or equal to 1.2 to a frame to form a dust cover;
   resting the dust cover on a photomask;
   positioning a semiconductor wafer proximate the photomask; and
   exposing the semiconductor wafer to radiant energy.

14. The method of claim 13 further comprising forming the fluoropolymer substrate from an amorphous fluoropolymer having between 30 and 99 mole percent perfluoro-2,2-dimethyl-1,3-dioxole and complementary amounts of at least one comonomer and the fluoropolymer substrate having a refractive index between 1.29 and 1.44.

15. The method of claim 13 further comprising exposing the semiconductor wafer to deep ultra violet radiation through the dust cover and photomask.

16. The method of claim 13 further comprising forming a plurality of adjoining inorganic anti-reflective coatings on the fluoropolymer substrate.

17. The method of claim 16 further comprising forming the adjoining inorganic anti-reflective coatings with a difference of approximately 0.1 in value of the respective refractive indices of the adjoining inorganic anti-reflective coatings.

18. The method of claim 13 further comprising forming the inorganic anti-reflective coating from material having a refractive index between 1.13 and 1.2.

19. The method of claim 13 further comprising forming an inorganic anti-reflective coating on both a to surface and a bottom surface of the fluoropolymer substrate.

20. The method of claim 13 further comprising replacing the coated fluoropolymer substrate after exposing the semiconductor wafer.

* * * * *